United States Patent [19]

Angersbach et al.

[11] Patent Number: 4,507,596
[45] Date of Patent: * Mar. 26, 1985

[54] POSITION ADJUSTING DRIVE UNIT

[75] Inventors: Wolfgang Angersbach, Darmstadt; Karl-Heinz Meier, Zeilhard, both of Fed. Rep. of Germany

[73] Assignee: Quick-Rotan Elektromotoren GmbH, Darmstadt, Fed. Rep. of Germany

[*] Notice: The portion of the term of this patent subsequent to Jul. 12, 2000 has been disclaimed.

[21] Appl. No.: 443,741

[22] Filed: Nov. 22, 1982

Related U.S. Application Data

[63] Continuation of Ser. No. 167,325, Jul. 10, 1980, Pat. No. 4,393,343.

[30] Foreign Application Priority Data

Jul. 25, 1979 [DE] Fed. Rep. of Germany ....... 2930228

[51] Int. Cl.³ ............................................... G05B 1/06
[52] U.S. Cl. .................................... 318/640; 361/415; 310/71
[58] Field of Search .................... 310/71, 72; 318/561, 318/640; 361/415

[56] References Cited

U.S. PATENT DOCUMENTS 4,080,759 3/1978 Klar et al. ............................ 361/415
4,223,257 9/1980 Miller ................................. 318/640

Primary Examiner—B. Dobeck
Attorney, Agent, or Firm—Michael J. Striker

[57] ABSTRACT

The position adjusting drive unit for a sewing machine having its work shaft driven by an electromotor with an adjustable rotary speed, includes a supporting box connected to the electromotor and including a power supply transformer and an activation mechanism for a signal generator for desired and actual values of the rotary speed of the motor and of the angular position of the working shaft; an exchangeable printed circuit board supports all electrical and mechanical component parts of the speed regulating and angular position adjusting circuits including the signal generators and the coupling rod between the activation mechanism in the supporting box and the part of the activation mechanism on the circuit board is guided into the proper coupling position when the circuit board is electrically connected to the power supply transformer.

8 Claims, 12 Drawing Figures

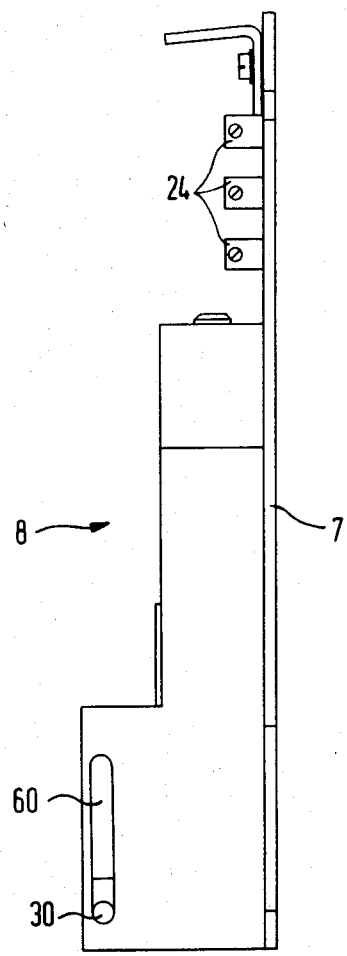
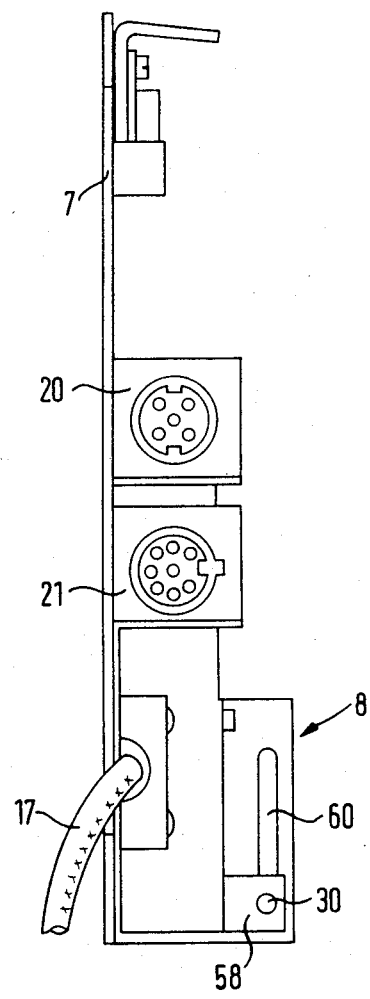
Fig. 3
Fig. 4

POSITION ADJUSTING DRIVE UNIT

This is a continuation of application Ser. No. 167,325, filed July 10, 1980, now U.S. Pat. No. 4,393,343.

BACKGROUND OF THE INVENTION

This invention relates in general to driving units for work spindles, and in particular to a position adjustable drive unit having a driving motor with adjustable rotary speed for use particularly in connection with sewing machines; the unit includes a regulator or controlling subunit which is provided with generators for producing signals corresponding to the actual rotary speed value and to the desired rotary speed value of the driving electric motor as well as to the actual position and to the desired position of the work spindle.

The position controlling drive units of this type are known, for example, from the U.S. Pat. Nos. 3,487,438, 3,532,953, 3,761,790, and 4,011,490.

In the following description, the position adjusting drive unit according to this invention will be explained in connection with an industrial sewing machine. It will be understood, however, that this unit can be readily adapted for numerous other adaptations, for example, for driving machine tools, winding machines for electrical capacitors, and the like. In industrial sewing machines which are also counted among machine tools and related products of the machine industry, a continuous increase of electronic components in the adjustable power drive units can be observed in recent designs. This development, however, causes considerable problems for final users inasmuch as the maintenance and servicing of such machines is traditionally done by mechanics in training who, even if experienced in the field of mechanics, usually have no skill in the field of electronics. From this point of view, the easiness to service and repair the position adjustable drive units in such machines is of particular importance.

SUMMARY OF THE INVENTION

It is, therefore, a general object of the present invention to provide an improved position adjustable drive unit for machine tools which in the case of a failure can be repaired not only by a mechanic who is untrained in electronics but also by persons without any technical skills such as, for instance, an operator of the sewing machine.

In keeping with this object, and others which will become apparent hereafter, one feature of the invention resides in the provision of an improved position adjusting drive unit provided with a driving electrical motor having an adjustable rotary speed, an electrical speed regulator for the motor, a generator for producing electrical signals corresponding to an actual value and to a desired value of the rotary speed of the electromotor, an electrical position adjuster including a generator for producing signals corresponding to an actual position and to a desired position of the driving shaft of the machine, and a common circuit board detachably connected to the motor and supporting and interconnecting the component parts of the speed regulator and the position adjuster.

Such an arrangement offers an essential advantage in the fact that upon the occurrence of a failure in the electronics of the drive unit, it is necessary only to exchange the old circuit board for a new one. Due to the fact that the circuit board includes the entire speed regulating circuit and the position adjusting circuit, it suffices to employ a simple connector without unsoldering or soldering complicated cable trunks. Any circuit testing during this exchange is completely eliminated. As a consequence, the replacement of the circuit board can be made by any untrained person.

The combination of the rotary speed regulating circuit and of the angular position adjusting circuit on a single circuit board has additional advantages from the manufacturing point of view. Particularly, by using a printed circuit board all solder points are made simultaneously in a machine without the use of manual operations. In this manner, not only the aforementioned cable loops for interconnecting the individual component parts of the rotary speed regulator and of the angular position adjuster are dispensed with but also cold solder connections which frequently occur during the manual soldering work are effectively eliminated. For this reason, the operational reliability is essentially increased and the overall manufacturing costs are favorably influenced.

In a further elaboration of this invention, the circuit board also supports and interconnects a connecting plug for the desired value and the actual value generators and if needed, additional subunits. The use of connectors for the desired value generators in the circuits of the rotary speed regulator and the position adjuster has the advantage of easier removal of disturbances which might occur in the desired value generator.

Preferably, the circuit board is insertable into a case or box containing a power supply transformer and connector parts matching those on the circuit board. In principle, it is also possible to include the power supply transformer into the circuits formed on the circuit board but, as known from practice, the defects in power transformance occur so rarely that for the subsequent service the probability for the replacement of the power transformer is so small that it can disregarded. Moreover, by installing the power supply transformer in the connector box of the unit, the finished circuit board has a relatively low weight and a flat configuration, which features are advantageous not only for manufacture but also for transportation and storing of the replacement boards.

The connector box further includes an activation device for the desired value generator which is mounted on the circuit board. Upon the insertion of the circuit board into the box, an activation rod projecting from the generator is automatically coupled to the activation unit. In this manner, a correct coupling of the desired value generator to its control mechanism such as, for example, a hand operated linkage, is always insured after the exchange of the circuit board.

The basic circuit board can also be provided with additional plug-in connectors for one or more additional circuit boards. The additional circuit boards can be used, for. example, for adjusting the rotary speed regulator and the position adjuster to different types of the driven machine. In particular, the additional circuit boards include control circuits for one or more additional functions of the work machine and more particularly of an industrial sewing machine, incorporating the driven shaft. The additional control circuits may include, for instance, a rotary speed limiting stage, a stage for presetting a desired rotary speed of the thread cutter, a stage for controlling a predetermined course of the high rotary speed of the machine (for example, for a linear, square or exponential increase of the rotary drive in the range of high speeds), furthermore the stages for severing and/or wiping of the threads, for relieving the tension of the thread, the activation of the press shoe and the feed reversal (in the forward or backward direction), a stage for arresting the stitches, a stage for controlling the length of the stitches or a stage for checking of additional signal generators employed in the sewing machine such as, for example, light barriers for detecting the beginning and the end of the fabric.

All connecting sockets and setting potentiometers are preferably soldered simultaneously with the remaining connection points in the circuits present on the circuit board in order to avoid manual soldering operation and cable connections.

In another modification of this invention, the rotary speed regulator and the angular position adjuster supported on the circuit board are preferably in the form of integrated circuits operating as microprocessor systems. Such systems are not only of extremely low weight and space saving, but also enable a versatility of matching to special application requirements. The microprocessor system can include one or more integrated circuit chips.

The desired value generator includes preferably a light barrier with a corresponding aperture plate or diaphragm. Such a signal generator has a very small size and therefore is particularly suitable for installation on the circuit board. The light barrier and its aperture plate can be designed as an analog signal generating system. According to a further advantageous development of this invention, the desired value signal generator, however, is equipped with several light barriers and with correspondingly coded aperture plates for generating a digital signal of the desired value of the rotary speed. Such a digitally coded signal can be exactly and directly processed in the microprocessor system. A stepped signal corresponding to the desired value of the rotary speed further enables to bypass the resonant points resulting during the rotation of the driven shaft in the working machine so that the resonance phenomena technically remain without any disturbing effect. The light barriers eliminate any mechanical contacts or sets of contacts. Generally, it is advantageous when the signal for the desired rotary speed is combined into a common structural unit with the signal generator for the actual position of the shaft.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 3 is a side view of the circuit board of FIG. 2 viewed in the direction of arrows III;

FIG. 4 is a side view of the circuit board of FIG. 2 viewed in the direction of arrows IV;

DESCRIPTION OF THE PREFERRED EMBODIMENTS

Figure 1:
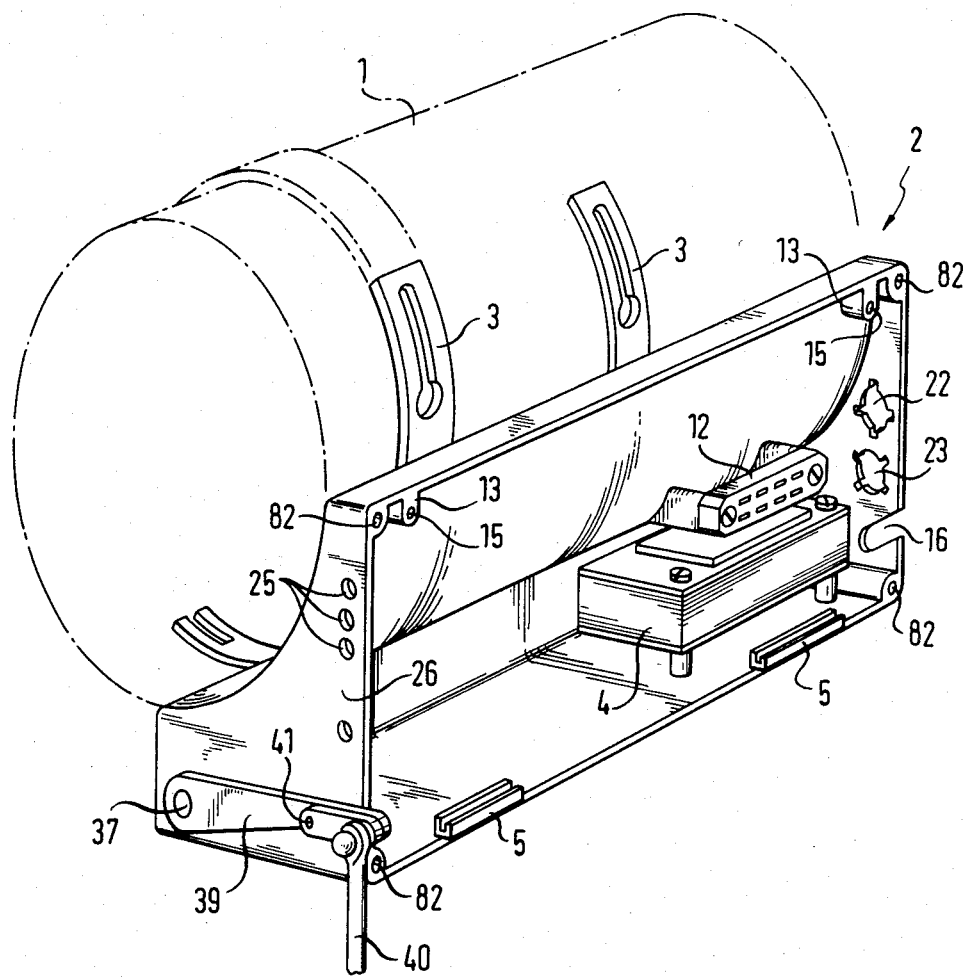
FIG. 1 is a perspective view of the position adjusting drive unit of this invention shown without the circuit board.

Referring first to FIG. 1, there is depicted schematically a driving electrical motor 1 of the type having a controllable rotary speed. A supporting contact box 2 is united with the motor 1 by means of clamping rings 3. The driving motor 1 is preferably a clutch case motor of suitable known construction described, for example, in the aforementioned U.S. patents. A direct current electrical motor having adjustable rotary speed can also be employed. In the box 2 there are arranged, apart from other non-illustrated component parts, a power supply transformer 4 for energizing the control circuit for the rotary speed and the control circuit for the angular position adjustment of the driven shaft. The box 2 has an open outer side and is provided with two receptacles 5 arranged at the lower edge of the opening and having a U-shaped cross section for receiving projections 6 formed on a printed circuit board 7, as illustrated in FIGS. 2-4.

Figure 2:
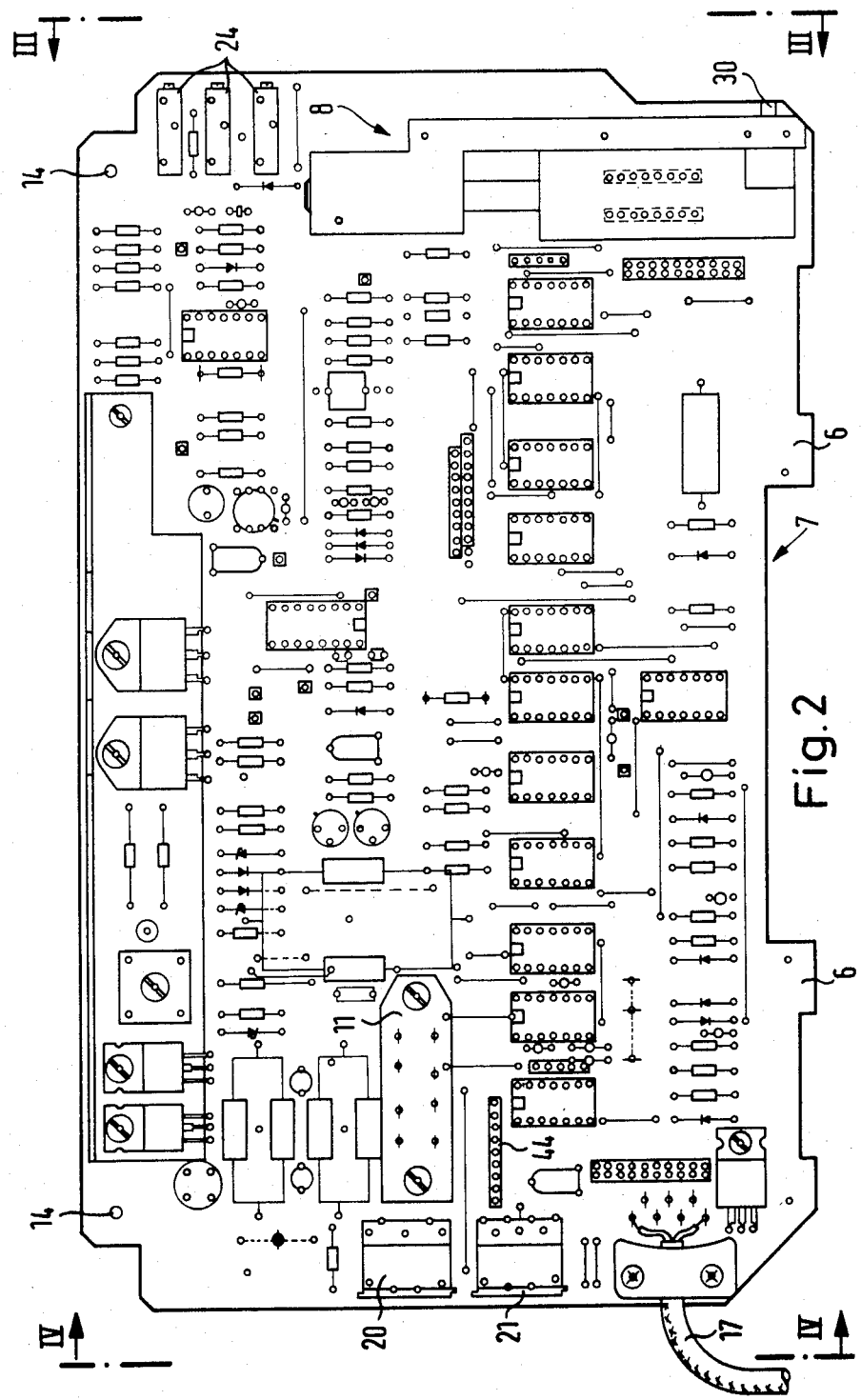
FIG. 2 is a top view of a circuit board for the unit of FIG. 1.

The circuit board 7 as indicated in FIG. 2 supports and interconnects the component parts of operative circuits of a rotary speed regulator and of an angular position adjuster for the driving motor. These individual circuits are known from prior art and are described, for example, in the aforementioned U.S. Pat. Nos. 3,487,438, 3,532,953, 3,761,790, and 4,011,490. In addition, the circuit board 7 includes also a signal generator 8 for generating a signal corresponding to the desired value of the rotary speed and of the desired angular position. A connector plug 11 is mounted on the board 7 in such a manner that upon the insertion of the retaining projections 6 into the corresponding receptacles 5, the pins of the connector plug 11 enter into the connector socket 12 mounted in the supporting box 2. The connector parts 11 and 12 detachably connect the rotary speed controlling circuit and the angular position adjustment circuit on the common circuit board 7 to the supply voltage provided by the transformer 4. The upper edge of the board 7 abuts against surfaces 13 formed on the box 2 and is secured to the latter by screws passing through holes 14 in the board and engaging screw holes 15 in the abutment surfaces 13.

The right end wall of the supporting box 2 is formed with a cut out 16 for leading through a cable 17 attached to the circuit board 7. In the event that a coupling or case motor is used as the driving motor 1, the cable 17 is connected to the clutch or brake unit of the motor as well as to a press pedal control unit for the motor 1 to energize the sewing machine. Upon the insertion of the circuit box 7 into the supporting box 2, connector sockets or sleeves 20 and 21 mounted at a lateral side of the board 7 are aligned with corresponding openings 22 and 23 in the right end wall of the box 2. Through the openings 22 and 23 plugs of additional non-illustrated cables can be inserted into the connector circuits 20 and 21. These additional cables connect the combined regulating and adjusting circuits on the board 7, for example, to a thread cutting system and to an angular position feeler which is operatively coupled to the top shaft for driving the needle arm to detect the momentary angular position of the top shaft. Similarly, the trimmer potentiometers 24 which are arranged at the left end of the circuit board 7 in FIG. 2 are in alignment with openings 25 in the left end side wall 26 of the box 2 so that the trimming potentiometers are easily accessible from the outside.

Figure 5:
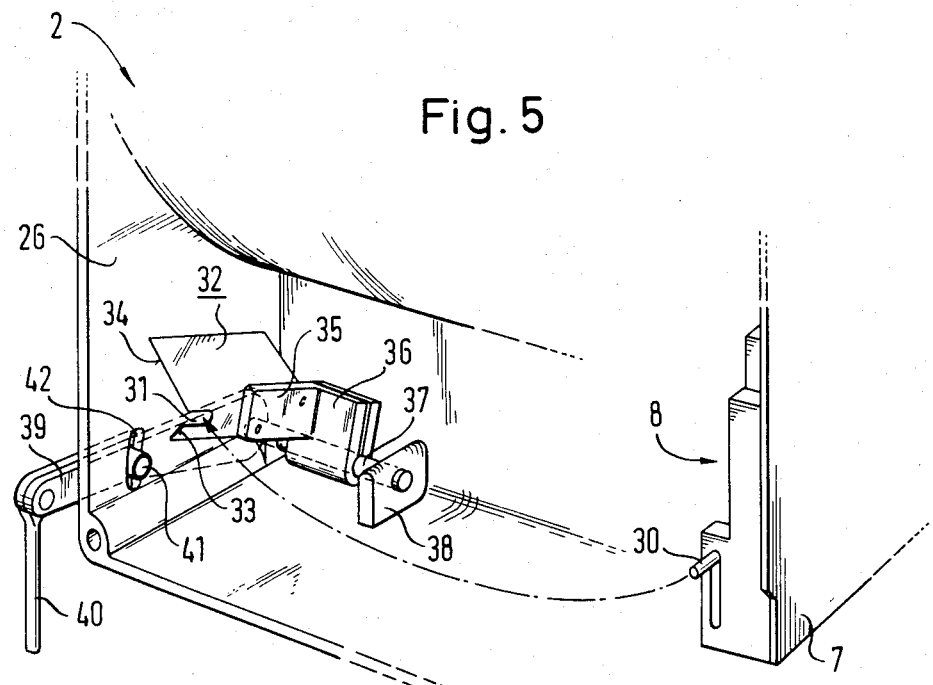
FIG. 5 is a cutaway perspective view of the unit of FIG. 1 shown with the activating mechanism for the desired value signal generator.

The signal generator 8 for the desired value of the rotary speed as well as for the desired angular position of the work spindle (top spindle for the needle arm in the sewing machine) is controlled by an activation pin 30 projecting from the left end of the circuit board 7. As is indicated in FIG. 5, during the installation of the board 7 on the supporting box 2, the activation pin 30 enters a slot 31 in a guiding plate 32 of an activation mechanism which is also arranged inside the box 2. The guiding plate 32 has a V-shaped configuration defining two diverging guiding surfaces 33 and 34 whereby the coupling slot 31 is formed at the apex edge of these guiding surfaces. In this manner, it is ensured that the activation pin 30 during the installation of the circuit board is reliably guided into the slot 31. The guiding plate 32 is secured to an arm 35 of a lever 36 firmly connected to a shaft 37 which at one end thereof is pivotably supported in a bearing block 38. The other end of the shaft 37 passes through the lateral wall 26 of the box 2 and is also rotatably supported thereon. The projecting end of the shaft 37 is connected to a control lever 39 which in turn is hinged to an adjustment rod 40. The adjustment rod 40 is linked to a non-illustrated control pedal. The control arm 39 is also provided with lateral pin 41 which projects into a guide slot 42 formed in the lateral wall 26 of the box 2 so that the angular displacement of the control lever is limited within the range of the guide slot.

Apart from the signal generator 8 for the desired rotational speed, the connector block 11, the connector sockets 20 and 21, the trimming potentiometers 24 and the remaining component parts of the rotary speed regulating circuit and of the angular position adjusting circuit, as indicated schematically in FIG. 2, and which are soldered to a printed circuit in a single soldering step, the circuit board 7 also supports one or more connector sockets 44 for plugging in additional or supplementary circuit boards. Such additional circuit boards can serve for adding supplementary operational functions to the machine. As mentioned before, the rotary speed regulator and the angular position adjusters are preferably constructed as a microprocessor system.

Figure 6:
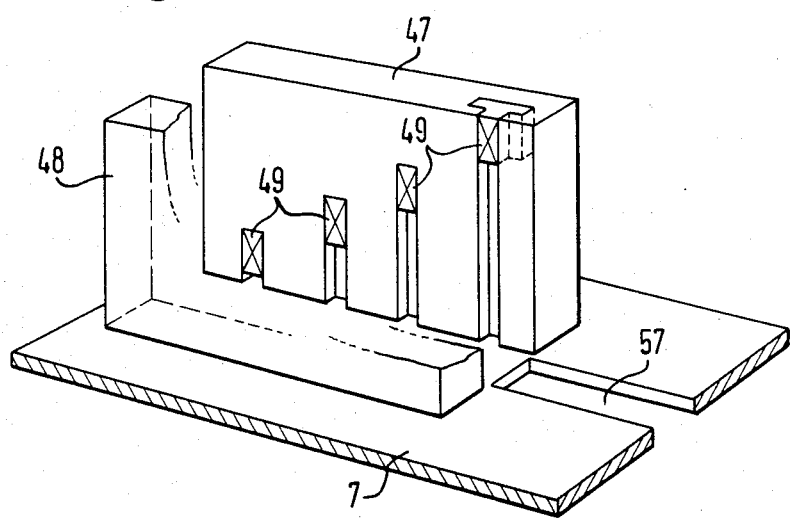
FIG. 6 is a perspective view of a cutaway portion of the circuit board with a group of light barriers.
Figure 7:
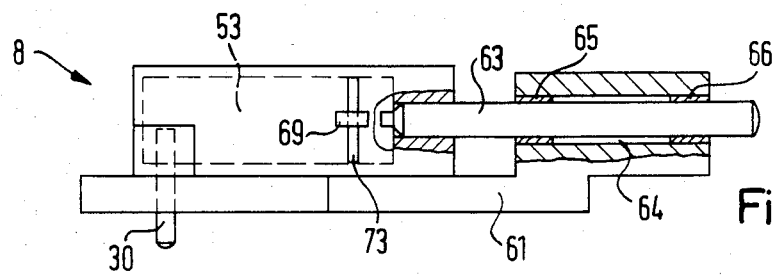
FIG. 7 is a side view partly in section of a signal generator for the desired value of the rotary speed.
Figure 8:
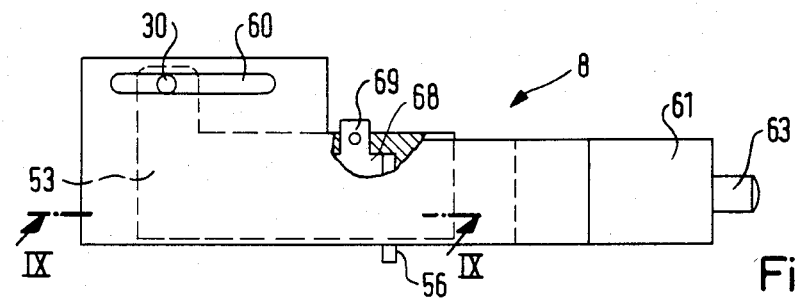
FIG. 8 is a top view of the signal generator of FIG. 7.
Figure 9:
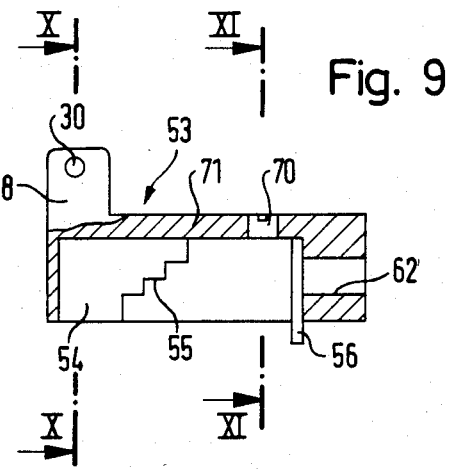
FIG. 9 is a sectional side view of a slider of the signal generator of FIG. 8 taken along the line IX—IX.
Figure 10:
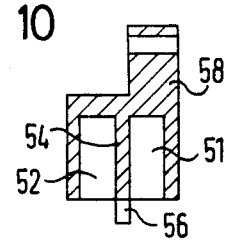
FIG. 10 is a sectional side view of the slider of FIG. 9 taken along the line X—X.
Figure 11:
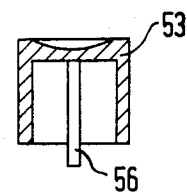
FIG. 11 is another sectional side view of the slider of FIG. 9 taken along the line XI—XI.
Figure 12:
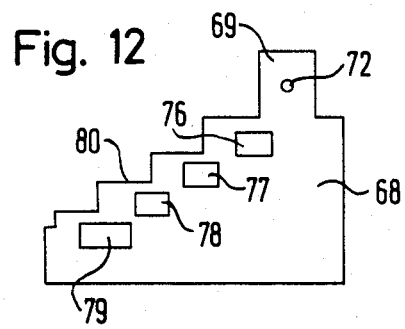
FIG. 12 is a side view of an aperture or stop plate connected to the slider of FIG. 9.

The signal generator 8 for the desired value includes a pack of photodiodes 47 and a pack of phototransistors 48 arranged on the circuit board 7 opposite each other with a certain clearance therebetween. As can be seen from the perspective illustration in FIG. 6, the pack of photodiodes 47 includes four light-emitting diodes 49 acting as light transmitters. Each light-emitting diode faces a phototransistor acting as a light receiver and forming with the light-emitting diode a light barrier. In this manner, the signal generator 8 is formed with four light barriers. Packs 47 and 48 project, respectively, into chambers 51 and 52 (FIG. 10) of a slider 53 which is movable in its longitudinal direction on the circuit board 7. The chambers 51 and 52 are separated by an intermediate partition 54 extending over a portion of their longitudinal dimension and, as seen from FIG. 9, the free edge 55 of the partition is stepped. The individual steps of the edge 55 are levelled with respective light barriers. The slider 53 is provided with a downwardly directed guiding pin 56 cooperating with a guide slot 57 (FIG. 6) in the circuit board 7. An upwardly projecting extension 58 formed on the slider 53 is provided with an activation pin 30 which is guided in an oblong slot 60 formed in a guiding part 61 which is rigidly connected to the board 7 (FIGS. 7-9). The end face of the slider 53 remote from the intermediate partition 54 is formed with a bore 62 into which is forced the end of a guiding rod 63. The free end of the guiding rod 63 passes through an elongated bore 64 of the guiding part 61 and is supported therein for a sliding movement in slide bearings 65 and 66. A step plate 68 is rigidly connected to the slider 53 and is aligned in the longitudinal direction of the slider with the intermediate partition 54. An upwardly directed projection 69 of the stop plate 68 passes through a slot 70 in the upper wall 71 of the slider 53; the projection 69 is formed with a hole 72 for retaining pin 73 which is anchored in the upper wall 71 of the slider 53 and releasably connects the stop plate 68 to the slider. The stop plate 68 is formed with four stop apertures 76, 77, 78, and 79 arranged at the levels of respective light barriers in the packs 47 and 48; the edge of the stop plate facing the stepped edge of the intermediate partition 54 is formed with complementary steps 80 which are again levelled with the respective light barriers. The steps 80 at the edge of the stop plate all together with the steps 55 at the opposite edge of the intermediate partition 54 define therebetween additional stop apertures. In adjusting the position of the slider 53 and of the stop plate 68 by means of the activation pin 30, the light barriers in an alternating combination are either uninterrupted or interrupted. The stop apertures 76-79 as well as the additional stop apertures delimited by the stepped edges 55 and 80 can be designed for blocking according to a Gray code. By activating the pedal and the corresponding displacement of the adjustment rod 40, several values, for example, twelve desired values of the rotary speed can be selected, whereas by activating the pedal rearwards signals corresponding to the desired holding angular position of the work shaft is reversed from "needle up" to "needle down" or vice versa. The steps of the desired rotary speed can be simply selected so that, for example, in view of the resonance phenomena of the machine the undesired ranges of the rotary speed can be omitted.

During the assembly of the drive unit of this invention, the circuit board 7 is first attached to the box 2. In doing so, the connector plug 11 enters automatically the connector socket 12 and the electrical connection between the circuit board 7 and the power supply circuit in the box 2 is established, that means, electrical connection of the rotary speed regulator and the angular position adjuster is electrically coupled to the power supply transformer 4. Without any additional manipulation, as soon as the circuit board is applied against the open side of the box 2, the mechanical connection between the activation rod 30 of the signal generator 8 and the adjustment rod 40 is completed. Thereupon, the board is fastened to the box 2 by screws engaging the threaded bores 82 and covered by a non-illustrated covering member.

If a failure occurs in the electronics of the drive unit of this invention, it is no longer necessary to locate the trouble by time-consuming measurements which can be made only by a specialist. It is only necessary to exchange a spare circuit board 7 for the defective one whereby all mechanical and electrical connections are made automatically in the aforedescribed manner.

The drive unit of this invention is applicable for a great variety of machine tools such as, for example, sewing machines. In particular, all or a major portion of the existing types of sewing machine can be equipped with a standard driving motor 1 and a standard box 2 whereas the matching of the motor to the particular machine is made by the aforementioned additional circuit boards connectable to the basic circuit board 7. The motor 1 and the control box 2 can be economically made in large production series and held in store. In order to fulfill different application requirements, it is only necessary to employ the supplementary circuit boards in addition to the basic circuit board 7.

It will be understood that each of the elements described above, or two or more together, may also find a useful application in other types of constructions differing from the type described above.

While the invention has been illustrated and described as embodied in a drive unit for use with sewing machines, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or the specific aspects of this invention.

What is claimed as new and desired to be protected by Letters Patent is set forth in the appended claims.

1. A position adjusting drive unit for a rotary shaft of a sewing machine, comprising a driving electrical motor having an adjustable rotary speed, an electrical speed regulating circuit for said motor, an electrical angular position adjusting circuit for the rotary shaft of the machine, operator-adjustable means connected to said circuits for generating signals corresponding to desired values of the rotary speed and of the angular position, means connected to said circuit for generating signals corresponding to actual values of the rotary speed and of the angular position, a circuit board supporting and interconnecting the electrical and mechanical component parts of said circuits and of said operator-adjustable signal generating means and supporting connectors for connecting said means for generating signals corresponding to actual values of the rotary speed and of the angular position, one of said mechanical component parts being an activation mechanism for said means for generating signals corresponding to desired values of said rotary speed and of said angular position, and a supporting box mechanically attached to said motor and having means for disconnectably supporting said circuit board, said supporting box further including a complementary activation device having guiding means for guiding and coupling said activation mechanism when said circuit board is attached to said supporting box.

2. A drive unit as defined in claim 1, wherein said circuit board supports additional connectors for connecting external supplementary operating means.

3. A drive unit as defined in claim 1, wherein said circuit board includes additional connector sockets for connecting at least one auxiliary circuit board.

4. A drive unit as defined in claim 3, wherein said auxiliary circuit boards support and interconnect control circuits for additional operational functions of the driven machine.

5. A drive unit as defined in claim 2, further including trimming potentiometers mounted and interconnected in the circuits on said board.

6. A drive unit as defined in claim 1, wherein said rotary speed regulating circuit and said position adjusting circuit are in the form of a microprocessor system.

7. A drive unit as defined in claim 9, wherein said microprocessor system includes at least one integrated circuit chip.

8. A position adjusting drive unit for a rotary shaft of a sewing machine, comprising a driving electrical motor having an adjustable rotary speed; an electrical speed regulating circuit for said motor; an electrical angular position adjusting circuit for the rotary shaft of the machine; operator-adjustable means connected to said circuits for generating signals corresponding to desired values of the rotary speed and of the angular position; means connected to said circuit for generating signals corresponding to actual values of the rotary speed and of the angular position; a common circuit board supporting and interconnecting the electrical and mechanical component parts of said circuit and of said operator-adjustable signal generator means, said board being provided with connectors for connecting said means for generating signals corresponding to actual values of the rotary speed and of the angular position, and with a power supply connector plug; one of said mechanical component parts being an activation mechanism for said means for generating signals corresponding to desired values of said rotary speed and of said angular position; a supporting box mechanically attached to said motor and having circuit board supporting means for disconnectably supporting said circuit board, said supporting box further including a complementary activation device having guiding means for guiding and coupling said activation mechanism when said circuit board is attached to said supporting box; and a power supply transformer provided with a connector socket matching said connector plug.

* * * * *